(12) United States Patent
Ohsaki

(10) Patent No.: US 6,198,143 B1
(45) Date of Patent: Mar. 6, 2001

(54) SEMICONDUCTOR DEVICE INCLUDING A LAYER OF THERMALLY STABLE TITANIUM SILICIDE

(75) Inventor: Akihiko Ohsaki, Hyogo-ken (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1085 days.

(21) Appl. No.: 08/637,009

(22) Filed: Apr. 24, 1996

Related U.S. Application Data

(63) Continuation of application No. 07/552,190, filed on Jul. 13, 1990, now abandoned.

(30) Foreign Application Priority Data

Jul. 14, 1989 (JP) .................................... 1-183221

(51) Int. Cl.$^7$ .................................... H01L 23/48
(52) U.S. Cl. .................... 257/412; 257/413; 257/763; 257/770
(58) Field of Search .................... 357/23.1, 29.4, 357/4, 57, 715, 71 P, 67 S, 59 I; 257/770, 768, 763, 412, 413

(56) References Cited

U.S. PATENT DOCUMENTS

| 4,276,557 | * | 6/1981 | Levinstein et al. | 357/59 I |
| 4,818,715 | * | 4/1989 | Chao | 357/23.3 |
| 4,859,278 | * | 8/1989 | Choi | 357/23.11 |
| 4,905,073 | * | 2/1990 | Chen et al. | 357/23.1 |
| 4,907,048 | * | 3/1990 | Huang | 357/23.4 |
| 4,949,136 | * | 8/1990 | Jain | 357/23.4 |
| 5,012,320 | * | 4/1991 | Yamazaki | 357/59 I |

OTHER PUBLICATIONS

Ting et al "High Temperature Process Limitation of TiSi2", Journal of Electrochemical Society: Solid–State Science and Technology, vol. 133, No. 12 (Dec. 1986), pp. 2621–2625.
Jonkers et al "TiSi2 Local Interconnect and Salicide for Application in a Submicron CMOS SRAM Process" Device Technology.
Lau et al "Titanium Disilicide Self–Aligned Source/Drain + Gate Technology" by EDM 82 (1982), pp. 714–717.
Zheng et al "Interaction of TiSi2 Layers with Polycrystalline Si", Appl. Phys. Lett. 48 (12), Mar. 24, 1986.
Yang et al, "Study of Oxidation of TiSi$_2$ Thin Film by XPS", Japanese Journal of Applied Physics, vol. 23, No. 12 (Dec. 1984), pp. 1560–1567.
Ohsaki et al, "Thermally Stable TiSi Thin Films by Modification in Interface and Surface Structures", Extended Abstracts of the 21st Conference on Solid Devices and Materials, Tokyo (1989), pp. 13–16.

* cited by examiner

Primary Examiner—Donald L. Monin, Jr.
(74) Attorney, Agent, or Firm—McDermott, Will & Emery

(57) ABSTRACT

Highly refractory titanium silicide structure comprises a titanium silicide film formed on a silicon crystal surface and a thermal oxide film formed on this titanium silicide film. A manufacturing method of the highly refractory titanium silicide is as follows. Initially, titanium is deposited on surfaces including a silicon crystal surface to form a titanium film (12) of a predetermined thickness. This titanium film (12) is then heat-treated in vacuum or in a certain atmosphere which does not cause any oxidation, to form a titanium silicide film (13). Subsequently, further heat treatment at temperatures between 600° C. and 1,000° C. in oxygen atmosphere is done for a predetermined time to oxidize the surface of the titanium silicide film (13). This oxidization of the surface of the titanium silicide film (13) restrains agglomeration in the titanium silicide which might occur in the subsequent annealing, so that the resistance value increase can be prevented.

13 Claims, 9 Drawing Sheets

PRIOR ART

SEMICONDUCTOR DEVICE INCLUDING A LAYER OF THERMALLY STABLE TITANIUM SILICIDE

This application is a continuation of application Ser. No. 07/552,190 filed Jul. 13, 1990 now abandoned.

BACKGROUND OF THE INVENTION

1. Field of the Invention

The present invention relates generally to a manufacturing method of highly refractory titanium silicide, and more particularly, to highly refractory titanium silicide used, for example, for formation of conductive layers on surfaces of gate electrodes source-drain regions and of salicide transistors or highly refractory interconnections in other semiconductor devices, and a manufacturing method thereof.

2. Description of the Background Art

Titanium silicide (mainly $TiSi_2$) has the lowest resistivity among other high melting point metal silicide such as of titanium (Ti), molybdenum (Mo), and tungsten (W). Therefore, titanium silicide is among hopeful materials for highly refractory interconnections of various types in semiconductor devices. Among the others, salicide (Self-Aligned Silicide) has attracted particular attention for its application to transistors.

A salicide transistor is constituted by forming a high melting point metal silicide film only over the respective surfaces of a gate electrode and source-drain regions of an MOS (Metal Oxide Semiconductor) field effect transistor. The salicide transistor is characterized by the feature that the metal silicide film which has been selectively formed thereon lowers resistivity where it has been applied.

A cross sectional structure of a conventional salicide transistor is shown in FIG. 1. Referring to that view, there is shown a polycrystalline silicon gate electrode (referred to as "gate electrode" hereinafter) formed on a semiconductor substrate 1 with a gate insulating film 2 interposed therebetween. On both sides of the gate electrode 3 there are provided sidewalls 4, outside of which diffusion layers 5 are formed in surface of the semiconductor substrate 1 to be source/drain regions.

At the surfaces of the gate electrode 3 and diffusion layers 5 there are formed a metal silicide film 6 made up of a compound of silicon and a refractory metal such as titanium, tungsten, molybdenum or the like. Respective device formation regions are separated by a device isolating insulating film 7 and surfaces of the formed devices are covered with an interlayer insulating films 8. The interlayer insulating film 8 is provided with contact holes 9 in the areas over the gate electrode 3 and the diffusion layers 5, immediately under which there are formed impurity diffused layers 10. Additionally, metal interconnection layers 11 as of aluminum alloy are provided in the respective contact holes 9.

It is desirable to use titanium as a referectory metal for forming the metal silicide film 6, because the resistivity of titanium silicide is very low, that is, one-tenth of or less than that of other metal silicides.

Now, a manufacturing process of the salicide transistor will be described in the case where the metal silicide film 6 is formed of titanium silicide with reference to FIGS. 2A to 2E.

Initially, with reference to FIG. 2A an MOS type LDD (Lightly Doped Drain) structure is formed according to the manufacturing process of the general MOS type LDD structure transistor. That is, a transfer gate oxide film 2 is first formed on a p-type semiconductor substrate by the so-called LOCOS (Local Oxidation of Silicon) with a device isolating insulating film 7 surrounding the same. Thereafter, polysilicon is deposited over the entire surface of the transfer gate oxide film 2 to a certain film thickness by low pressure CVD, and then formed into a gate electrode 3 by photoetching. Subsequently, n-type impurities such as phosphorus ion are implanted in surface of the semiconductor substrate 1 with the gate electrode 3 as mask to form a diffusion layer 5a of low concentration. Furthermore, an insulating film made of silicon dioxide or the like is deposited over the entire surface of the semiconductor substrate 1 by CVD and formed into sidewalls 4 by vertical anisotropic etching. Additionally, n-type impurities such as arsenic ion are then implanted in the surface of the semiconductor substrate 1 with the gate electrode 3 and the sidewalls 4 as mask to form further diffusion forming layer 5b of high concentration. Usually, heat treatment at above 900° C. is done for the activation of the implanted impurities, and thus the structure shown in FIG. 2A is completed.

Secondly, a titanium film 12 of a predetermined thickness is formed over the entire surface of the resulting MOS type LDD structure by sputtering or the like (FIG. 2B). This titanium film 12 is generally formed to a thickness of 10 to 100 nm.

Following the above, heat treatment at 600° C. to 700° C. is done in nitrogen atmosphere. This heat treatment may also be done in vacuum or argon atmosphere. At this moment, mono-silicide or disilicide of titanium, i.e. TiSi or $TiSi_2$ is formed in the areas where the titanium film 12 contacts with any silicon surface, or at the surfaces of the gate electrode 3 and the diffusion layers 5 which have remained uncovered by the insulating films. On the other hand, the titanium film 12 over the regions covered with the silicon oxide films, or on the surfaces of the device isolating insulating film 7 and the sidewalls 4 remains unreacted or is reacted with nitrogen to form titanium nitride (TiN). Therefore, by removing the TiN and unreacted Ti with a proper solution such as mixture of sulfuric acid and hydrogen peroxide solution, titanium silicide can be left formed only over the gate electrode 3 and the diffusion layers 5 to form source/drain regions (FIG. 2C). Meanwhile, the titanium silicide at this moment comprises TiSi as well as $TiSi_2$.

Further heat treatment at about 800° C. for a predetermined time in nitrogen atmosphere (vacuum or argon atmosphere is also possible) enables a complete titanium disilicide ($TiSi_2$) layer 13 (referred to simply as "titanium silicide layer 13" hereinafter) to be formed.

Next, an interlayer insulating film 8 made of ailicate glass is deposited by CVD and then annealing at temperatures of 800° C. to 1,000° C. is done (FIG. 2D). This annealing is indispensable to planalize the interlayer insulating film 8 by reflow, for the sake of enhancing the reliability of a metal interconnectin layer 11 formed thereon.

Subsequently, contact holes are opened by, for example, etching in predetermined portions over the gate electrode 3 and the diffusion layers 5, through which impurities of the same conductivity type as that of diffusion layers 5 or n-type (such as phosphorus) are implanted into the semiconductor substrate 1.

Subsequently, further heat treatment at 800° C. to 1,000° C. is done to thermally diffuse the impurities implanted immediately under the contact holes 9, thereby forming impurity diffused layers 10 (FIG. 2E). This process enables the n-type impurity diffused layers 10 to be formed under the contact holes even when they have been opened in the areas a little shifted from the diffusion layers 5 to cover the device isolating insulating films 7 so that the contact resistance therein can be reduced. Also, this process has the effect to decrease the junction leakage current in PN junctions which may be a problem encountered, for example, when the concentration of the diffusion layers 5 immediately under the contact holes 9 is not sufficient. Accordingly, this process is called SAC (Self-Aligned Contact) due to the resulting self-alignment.

Finally, a metal interconnection layer 11 is formed of aluminum or the like thereby to complete the manufacturing of a salicide transistor (FIG. 2F).

In the salicide transistor formed as described above with the use of titanium silicide, when formed consistently to have good quality, the silicide film can reduce resistivity in the gate electrode 3 and the diffusion layers 5 down to one-tenth or less than that of other metal suicides due to its low resistivity. Therefore, an MOS type transistor of higher performance can be obtained.

Application of titanium silicide cannot be limited to the above mentioned salicide transistor, but also effective for interconnections of other semiconductor devices which require a heat resisting property. For example, it can be applied to formation of bit lines in a DRAM (Dynamic Random Access Memory) with stacked capacitor cells. There is further applicability of titanium silicide in the interconnections between separate devices such as a planar structure, for example, of a complementary MOS transistor and other general interconnections in semiconductor devices. Consequently, there has been an increasing demand for application of the titanium silicide in a wide range of the fields for semiconductor circuit formation where lower resistivity is required for electrodes or interconnections with the increased integration.

However, in forming a salicide transistor with the application of titanium silicide according to the above mentioned conventional manufacturing process, there has been encountered the following problems.

First, the annealing at 800° C. to 1,000° C. immediately after the interlayer insulating film 8 has been deposited by CVD brings about agglomeration in the titanium silicide 13 as shown in FIG. 2D. The causes of this agglomeration may be as follows. The titanium silicide film 13 heated up to elevated temperatures of 800° C. or higher begins to soften and flow. This flow occurs, as indicated by arrows in FIG. 3A, in the directions of surface or interface with the diffusion layer 5 of the titanium silicide film 13. That brings about a most stable situation where the interface energy both between the titanium silicide film 13 and the interlayer insulating film 8 and between the titanium silicide film 13 and the semiconductor substrate 1 is minimized, or deformation of the titanium silicide film 13 occurs such that the surface area is reduced to a minimum. Therefore, the film gets partially agglomerated with the other remaining excessively thin parts as shown in FIG. 3B. This phenomenon may even make the titanium silicide film 13 completely discontinuous (FIG. 3C), as well as destroying consistency of the film thickness. Accordingly, conductivity of the titanium silicide film 13 is degraded while the resistance value thereof is significantly increased. Such agglomeration in annealing of the titanium silicide with the resulting resistance value increase has been described in detail, for example, in "SOLID-STATE SCIENCE AND TECHNOLOGY, Vol. 133, No. 12, p.2621–p.2625".

As an example, the changes in resistance value as a function of annealing time is shown in a diagram of FIG. 4 with respect to a case where a 200 nm thick silicon dioxide film is deposited by CVD on about 48 nm thick titanium silicide layer and then annealed at 900° C. in nitrogen atmosphere. It can be understood from the diagram that the resistance value is considerably increased with the lapse of annealing time.

Such agglomeration of the titanium silicide 13 occurs again in the heat treatment to be given when the impurity diffused layer 10 is formed, with further outstanding undesirable effects. More specifically, as the flow goes ahead, the clustered agglomerations may get greater and extend through the diffusion layer 5 as shown in FIG. 3C, even encroaching upon the p-type region of the semiconductor substrate 1. When it comes to such a state, another problem of increased junction leakage current in the PN junction arises.

These phenomena not only prevent attaining the object of the salicide transistor to lower resistivity of the gate electrode 3 and the source/drain regions, but lead to malfunction of the transistor due to the leakage current.

The above mentioned agglomeration in the titanium silicide film is not limited to the case of salicide transistor formation only, but it is a common problem in forming of the above described bit lines in memory cells or general refractory interconnections using titanium silicide. This is because annealing at 800° C. or higher is frequently required in those cases to diffuse the implanted impurities or lower the contact resistance in contact portions.

The agglomeration in annealing at 800° C. to 1,000° C. is a phenomenon characteristic of titanium silicide only and does not occur in other silicides of high melting point metals such as tungsten or molybdenum. Accordingly, this agglomeration problem has been an obstacle to effectively apply titanium silicide of low resistivity to the salicide transistor instead of tungsten silicide and the like.

SUMMARY OF THE INVENTION

An object of the present invention is to provide highly refractory titanium silicide which does not form any agglomeration in annealing at 800° C. or higher and a manufacturing method thereof.

Another object of the present invention is to provide highly refractory titanium silicide capable of suppressing the resistance value increase of electrode surfaces even in the subsequent annealing treatment when applied to lower resistivity of the electrode surfaces in forming electrodes on surface of silicon crystals as in a field effect transistor, and a manufacturing method thereof.

Still another object of the present invention is to provide highly refractory titanium silicide which does not cause any increase in the resistance value even in the required annealing treatment when applied to form conductive interconnections on a substrate or a surface of an insulating film with a predetermined pattern, and a manufacturing method thereof.

Highly refractory titanium silicide according to the present invention comprises a titanium silicide film on surface of silicon crystals and a thermal oxide film formed thereon.

A manufacturing method of highly refractory titanium silicide according to the present invention first comprises the step of depositing titanium on surfaces including a silicon crystal surface to form a titanium film of a predetermined thickness. Heat treatment is then done to the formed titanium film in vacuum or in a certain atmosphere which does not cause any oxidation so as to form a titanium silicide film.

Thereafter, additional heat treatment at temperatures between 600° C. and 1,000° C. is done for a predetermined time in oxygen atmosphere to oxidize the titanium silicide film surface.

According to the present invention, following the formation of the titanium silicide film, the heat treatment at temperatures between 600° C. and 1,000° C. in oxygen atmosphere causes oxidation of the titanium silicide film surface. As a result, a film of titanium oxide (TiOx) and/or silicon dioxide ($SiO_2$) is formed on surface of the titanium silicide film.

The oxide film thus formed on the titanium silicide film surface tightly adheres to the titanium silicide film at their interface. Further, the oxide film has superior heat resisting property so that it never softens at 1,000° C. or below. Accordingly, even when the titanium silicide film softens and tends to flow in the following heat treatment such as annealing at temperatures approximately between 800° C. and 1,000° C., such movement will be prevented by the oxide film. As a result, the agglomeration of titanium silicide is suppressed and consistency of the titanium silicide film thickness is maintained even after the heat treatment.

Meanwhile, the reason why the temperature of 600° C. has been selected as lower limit of the heat treatment in oxygen atmosphere for the titanium silicide film is that if below 600° C., sufficient oxidation cannot be expected to form the desired oxide film. Furthermore, the reason for the upper limit of 1,000° C. is that if beyond 1,000° C., the titanium silicide film will begin to soften and flow before formation of the oxide films, which may result in the agglomeration of the titanium silicide.

The manufacturing method of highly refractory titanium silicide according to the present invention has particular applicability to formation of the titanium silicide film which is utilized to form electrodes on surfaces of polycrystalline silicon gate electrodes or diffusion layers forming source/drain regions in MOS field effect transistors.

According to the present invention, the heat treatment in oxygen atmosphere given to the titanium silicide film which has been formed on polycrystalline silicon gate electrodes or source/drain regions in an MOS field effect transistor prevents the titanium silicide from agglomerating even in the following anneal treatment, which considerably restrains the resistance value increase.

Furthermore, the manufacturing method of highly refractory titanium silicide according to another aspect of the present invention comprises the steps of forming a polycrystalline silicon film on a substrate or an insulating film surface with a predetermined pattern, depositing titanium on the polycrystalline silicon film surface, heat-treating the deposited titanium layer in vacuum or in a certain atmosphere which does not cause any oxidation so as to form a titanium silicide film, and heat-treating the titanium silicide film at temperatures between 600° C. and 1,000° C. in oxygen atmosphere to oxidize its surface.

According to the present invention, the titanium silicide film is prevented from any agglomeration even when annealed after formation, which enables provision of conductive interconnections having low resistance value on a substrate or an insulating film surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described with reference to the accompanying drawings.

FIGS. 5A through 5F show the respective steps of an embodiment where the present invention is applied to a manufacturing process of a salicide transistor.

Figure 1:
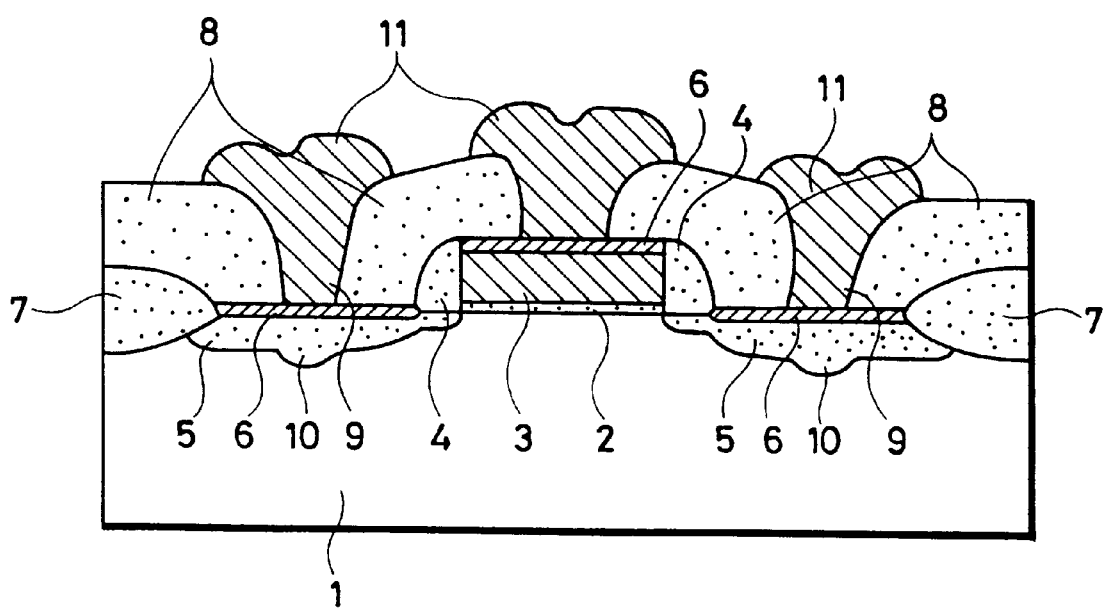
FIG. 1 is a cross sectional view showing structure of a conventional metal salicide transistor.
Figure 2A:
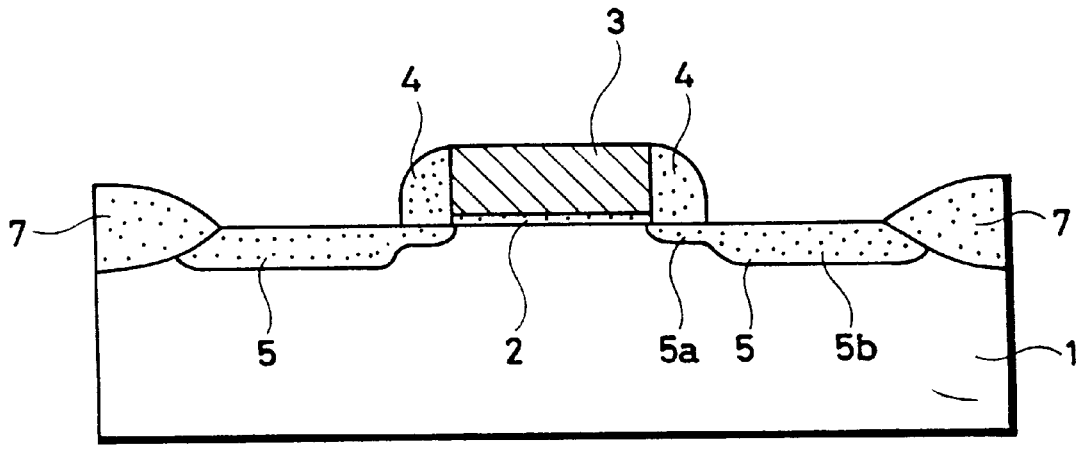
FIG. 2A, FIG. 2B, FIG. 2C, FIG. 2D, FIG. 2E and FIG. 2F are cross sectional views showing a manufacturing process of a conventional salicide transistor.
Figure 2B:
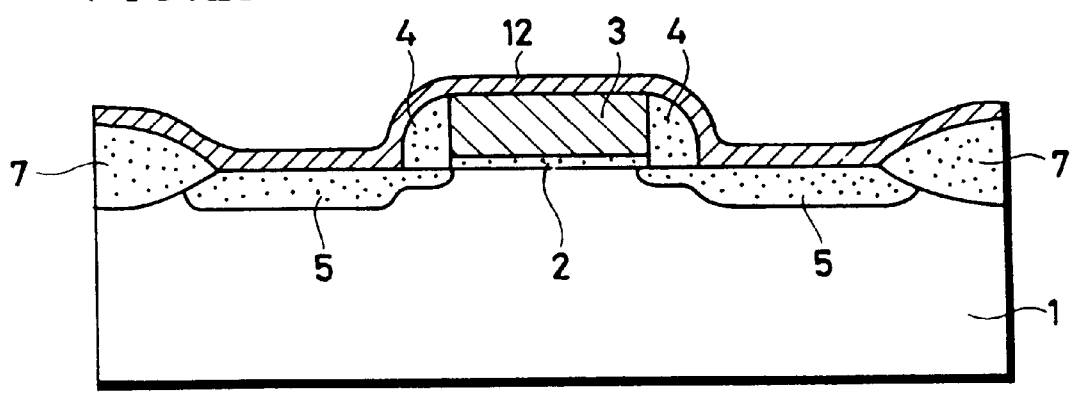
Figure 2C:
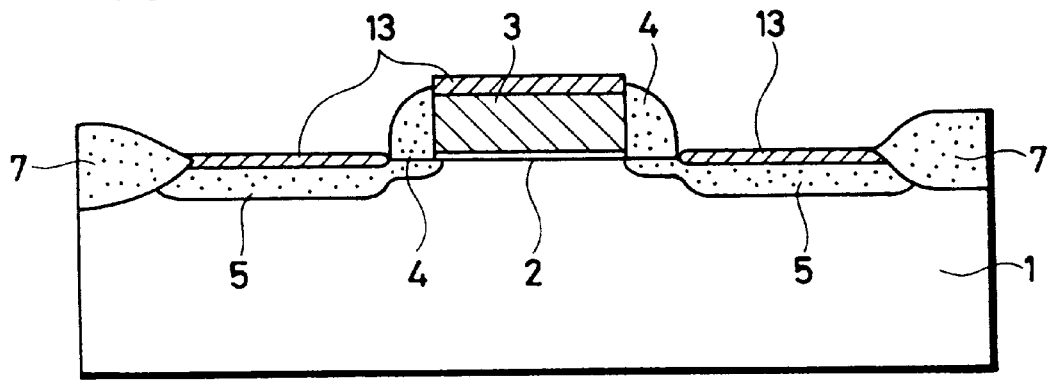
Figure 2D:
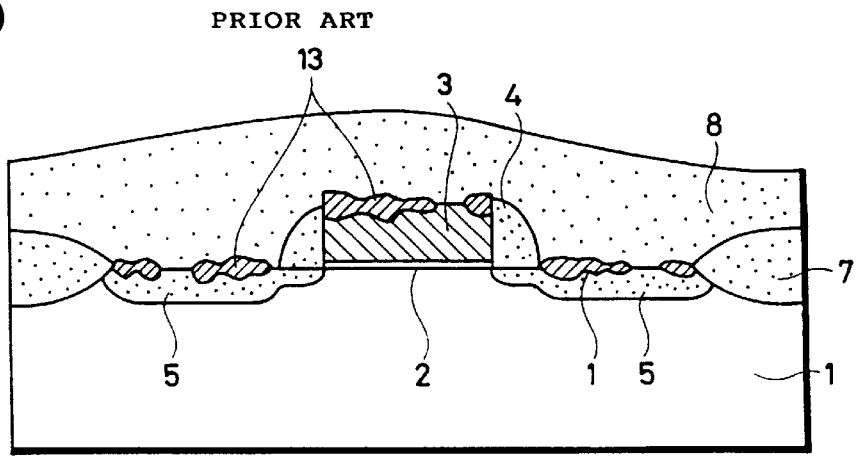
Figure 2E:
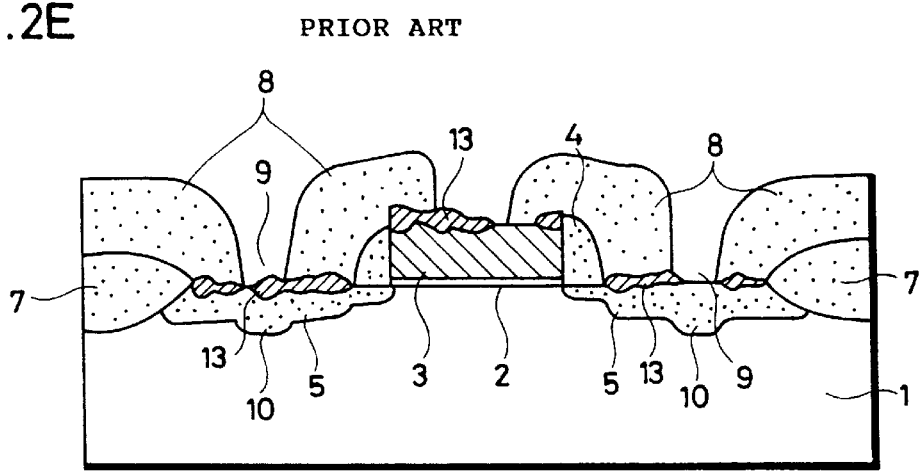
Figure 2F:
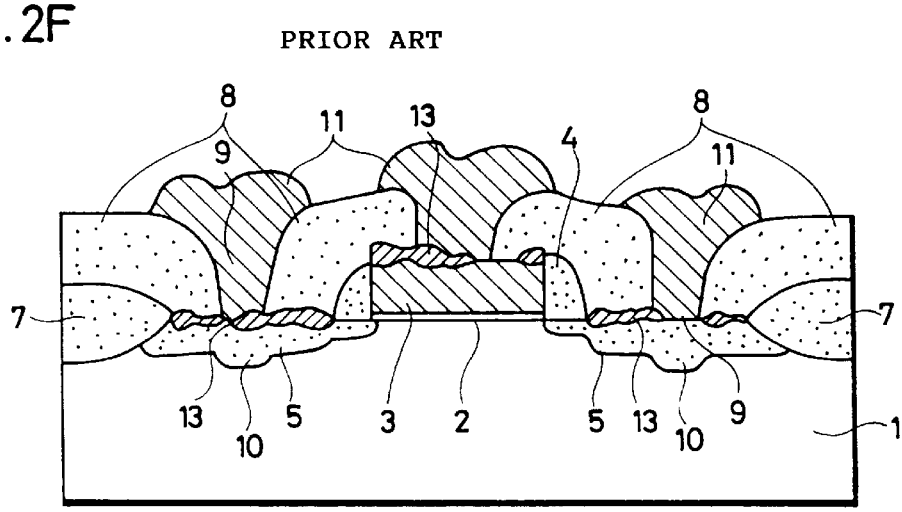
Figure 3A:
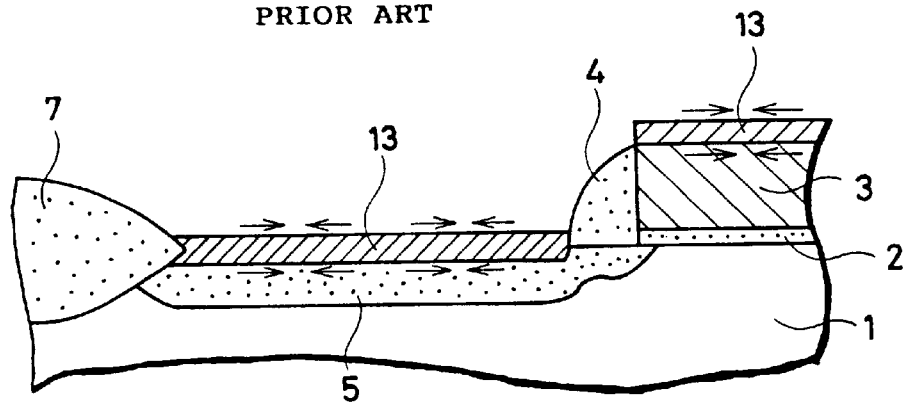
FIG. 3A, FIG. 3B, FIG. 3C are cross sectional views showing the agglomeration in annealing when a titanium silicide film is formed according to a conventional method.
Figure 3B:
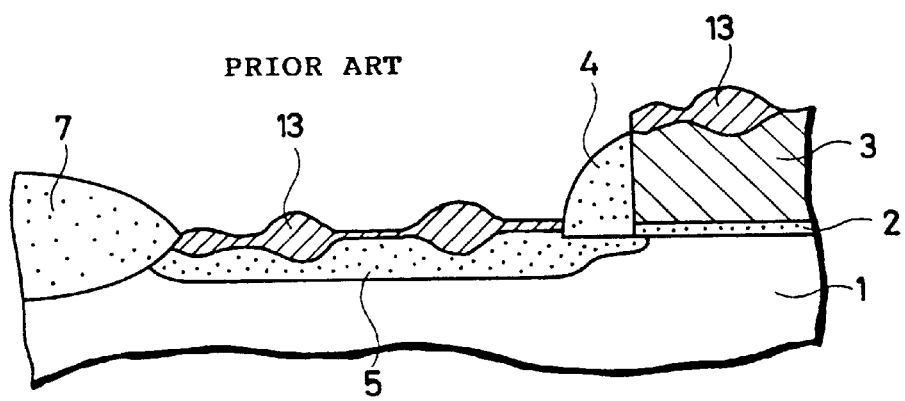
Figure 3C:
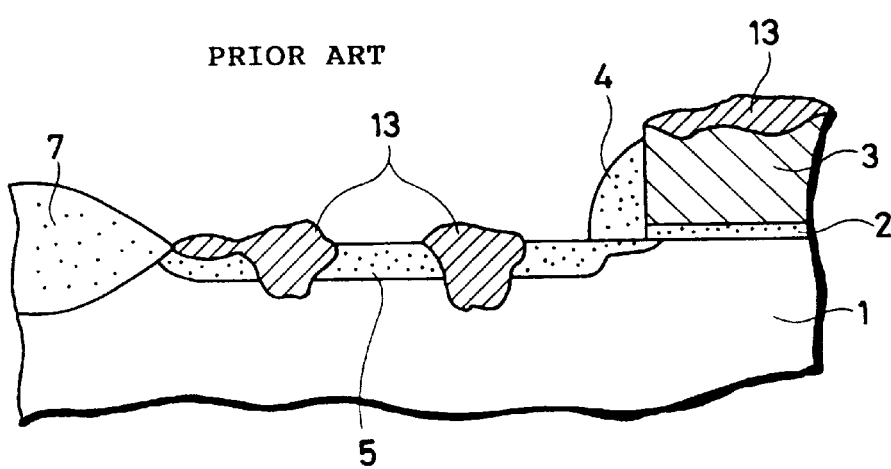
Figure 4:
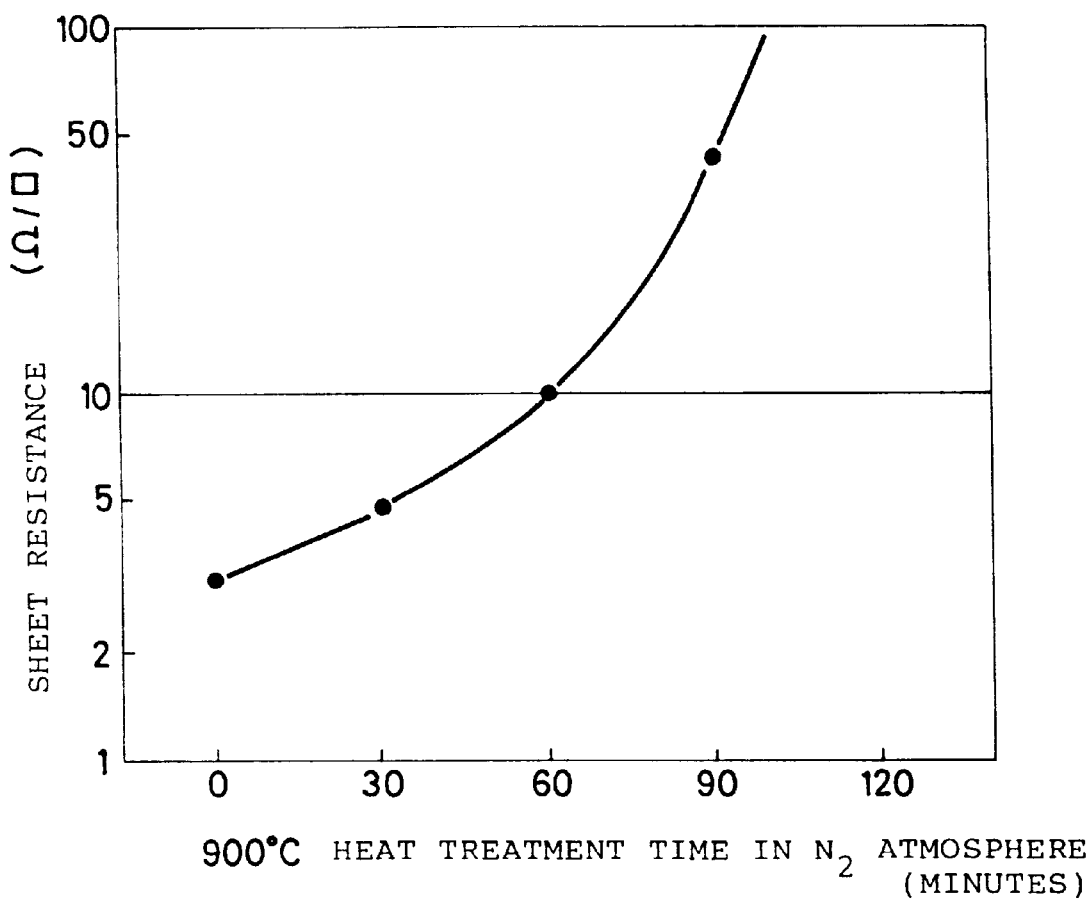
FIG. 4 is a diagram showing the resistance characteristic of the titanium silicide film formed according to the conventional method.
Figure 5A:
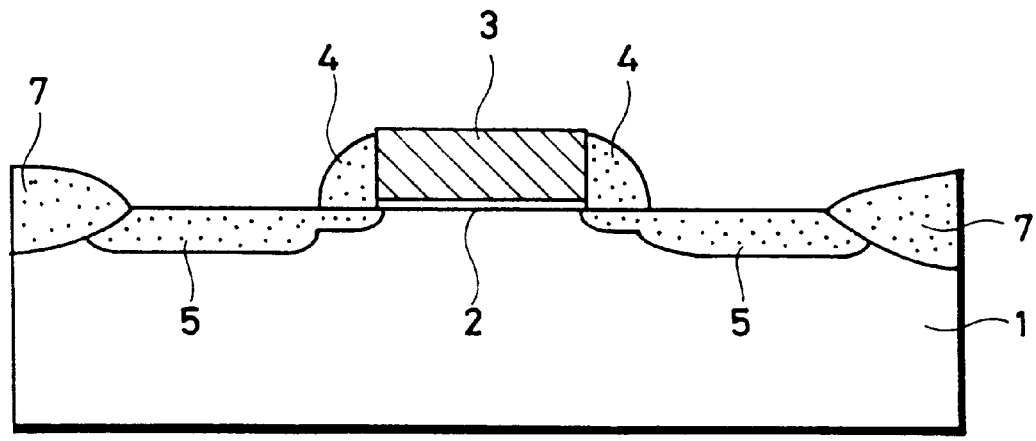
FIG. 5A, FIG. 5B, FIG. 5C, FIG. 5D, FIG. 5E, FIG. 5F are cross sectional views showing the respective manufacturing steps according to an embodiment of the present invention where the invention is applied to manufacturing of a salicide transistor.

In the present embodiment, a general MOS type LDD structure transistor is first formed as in the conventional case (FIG. 5A). That is, a gate electrode 3 is formed on a semiconductor substrate 1 with a gate insulating film 2 interposed therebetween. On the sides of the gate electrode 3 there are provided sidewalls 4, immediately under which diffusion layers 5 forming source/drain regions are formed at surface of the semiconductor substrate 1 outside the electrode. Furthermore, the respective device formation regions are separated by device isolating regions 7.

Figure 5B:
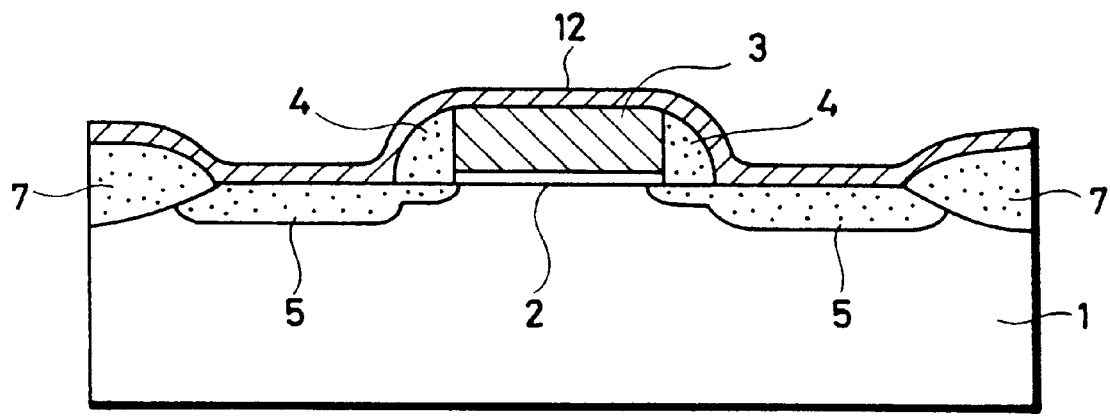
Figure 5C:
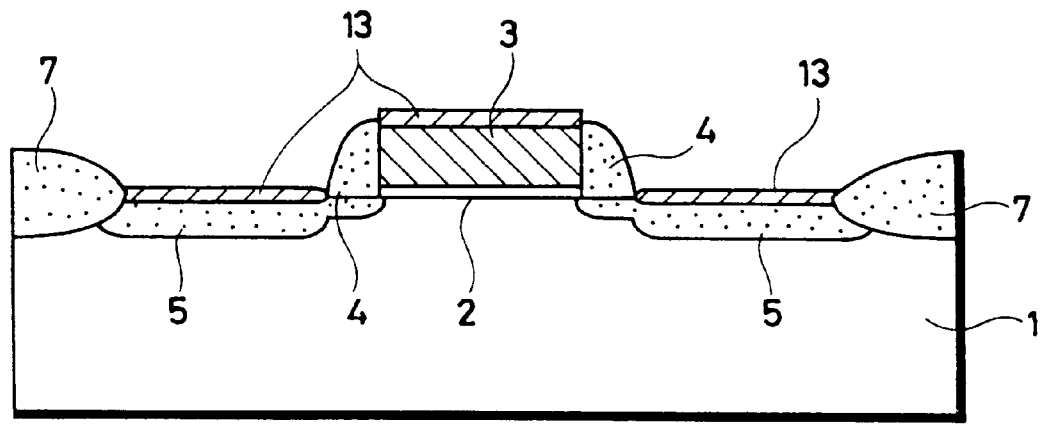

Subsequently, a titanium film 12 of a predetermined thickness is formed over the entire surface of thus formed MOS type LDD structure by sputtering and so on FIG. (FIG. 5B).

Thereafter, heat treatment at 600° C. to 700° C. is done for 30 to 60 minutes in nitrogen atmosphere. This heat treatment can be given also in vacuum, argon atmosphere or the like which do not cause any oxidation. At this moment, titanium monosilicide (TiSi) or titanium disilicide ($TiSi_2$) is formed at the interface between the titanium film 12 and the silicon film, or in the surface regions of the gate electrode 3 and the diffusion layers 5 which have remained uncovered with the insulating film. On the other hand, in the regions covered with the silicon oxide films, or on surfaces of the device isolating insulating films 7 and the sidewalls 4, Ti of the titanium film 12 remains unreacted, or reacted with nitrogen to form titanium nitride (TiN). Therefore, by removing the unreacted Ti with proper solutions such as mixture of sulfuric acid and hydrogen peroxide solution, titanium silicide (at this moment, TiSi, as well as $TiSi_2$, is comprised) can be formed only on the gate electrode 3 and the diffusion layers 5 to form source/drain regions.

Thereafter, further heat treatment at about 800° C. for a predetermined time in nitrogen atmosphere (vacuum or argon atmosphere may be also possible) enables formation of a complete titanium disilicide ($TiSi_2$) film 13 (referred to simply as "titanium silicide film 13" hereinafter).

The process above is the same as that previously described with respect to manufacturing of a conventional salicide transistor. What is different in the present embodiment from the conventional manufacturing method is that after formation of the titanium silicide film 13, heat treatment is performed for oxidation.

There are two kinds of processes for the oxidation, that is, rapid thermal annealing and furnace annealing. The former is done for about 30 seconds to several minutes, immediately after the formation of the titanium silicide film, and the latter is done for about several minutes to several hours, after a silicon oxide film of about 300 Å or less in thickness has been formed on surface of the titanium silicide film.

In the present embodiment, the rapid thermal annealing is performed for the oxidation of the titanium silicide film 13.

Figure 5D:
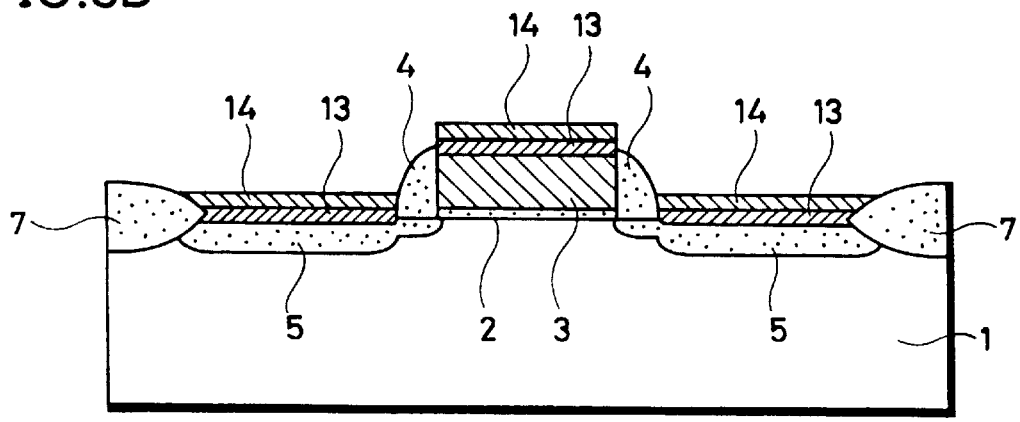

More specifically, after the formation of the titanium silicide film 13, heat treatment at temperatures between 600° C. and 1,000° C. is performed in oxygen atmosphere within a short time, for example, about 30 seconds to several minutes. It has been found, however, that after such heat treatment of 10 minutes or more, sheet resistance is increased. This heat treatment causes the surface of the titanium silicide film 13 to be oxidized, thereby forming a titanium oxide ($TiO_x$) film or a silicon dioxide ($SiO_2$) film (FIG. 5D).

Meanwhile, this heat treatment is done at temperatures ranging from 600° C. to 1000° C.; preferably from 800° C. to 900° C. A heat treatment below 600° C. can not cause any sufficient oxidation to form the desired oxide film even with enough time for it. Furthermore, a heat treatment above 1,000° C. causes the titanium silicide film to rapidly soften and flow, inducing the agglomeration, before formation of any oxide film.

Figure 5E:
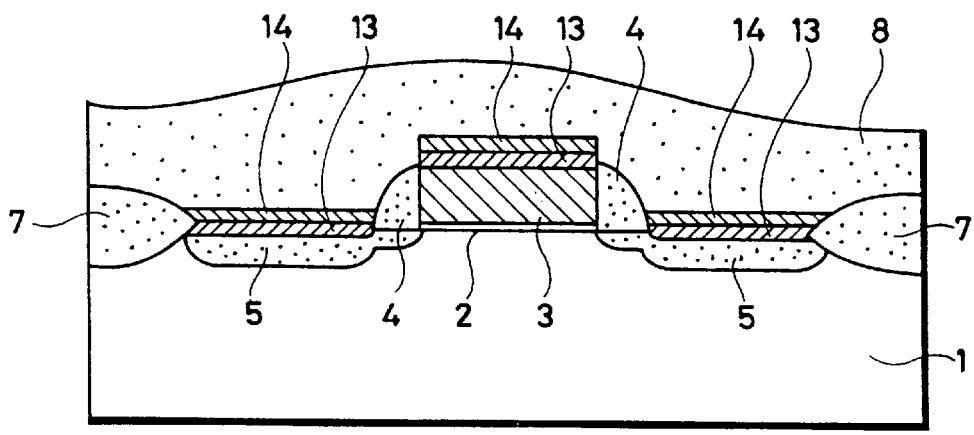

The interlayer insulating film 8 is then deposited by CVD and subsequently annealed at temperatures between 800° C. to 1,000° C. (FIG. 5E). This annealing is performed to enhance the interlayer insulating film quality, and to planarize the film by reflow as well.

In the conventional manufacturing method, there has been the problem that agglomeration occurs in the titanium silicide film 13 during this annealing. In the present embodiment, however, the agglomeration in the titanium silicide film 13 does not occur even upon annealing as shown in FIG. 5E so that the consistent film thickness can be maintained.

Figure 5F:
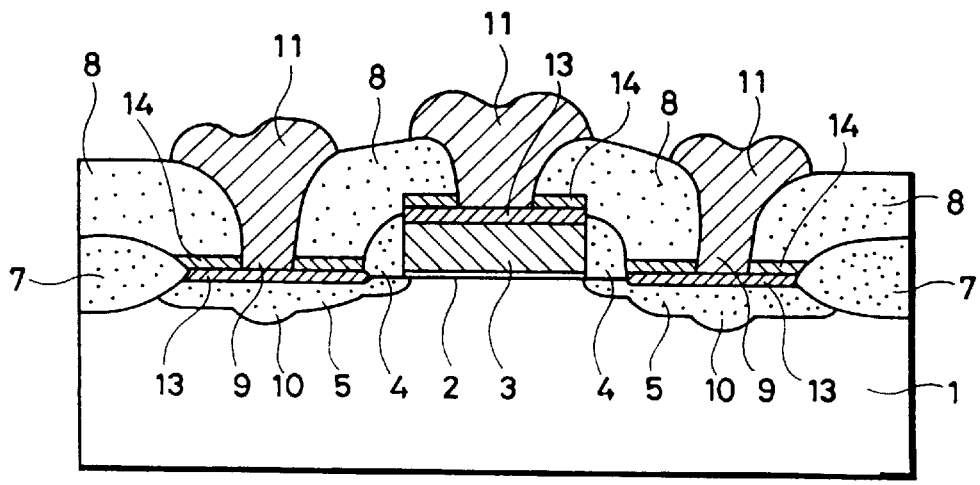

After annealing of the interlayer insulating film 8, as in the conventional case, contact holes 9 and impurity diffused layers 10 are formed by SAC and then metallic interconnection layers 11 are formed to complete a salicide transistor (FIG. 5F). Meanwhile, even upon further heat treatment in forming the impurity diffused layers 10 by SAC, titanium silicide film 13 gets no agglomeration formed therein and maintains its consistent film thickness as shown in FIG. 5F.

In the present embodiment, the heat treatment in oxygen atmosphere after formation of the titanium silicide film 13 will function as follows.

The heat treatment at temperatures between 600° C. to 1,000° C. in oxygen atmosphere for the titanium silicide thermal oxide film 13 causes oxidation of its surface and grows a film of titanium oxide ($TiO_x$) or silicon dioxide ($SiO_2$) before the softening and flow of titanium silicide begins. The oxide film thus formed does not soften even in the heat treatment at 800° C. to 1,000° C. and tightly adheres to the surface of the titanium silicide film 13. Accordingly, once the oxide film 14 of a proper thickness, for example, 50 Å to 500 Å and preferably 100 Å to 500 Å is formed as a result of the about 30 seconds or longer thermal oxidation of the surface of this titanium silicide film 13, it will restrain any flow of titanium silicide which could soften in the subsequent anneal at 800° C. to 1,000° C. Accordingly, the agglomeration can not occur in the titanium silicide film 13 so that the film thickness will be kept consistent and the increase in resistance value will be prevented.

Meanwhile, it is to be understood that the reason why the heat treatment in oxygen atmosphere does not cause any agglomeration in the titanium silicide film 13 is that before the titanium silicide film softens to flow, the oxide film 14 is formed to prevent it.

Figure 6:
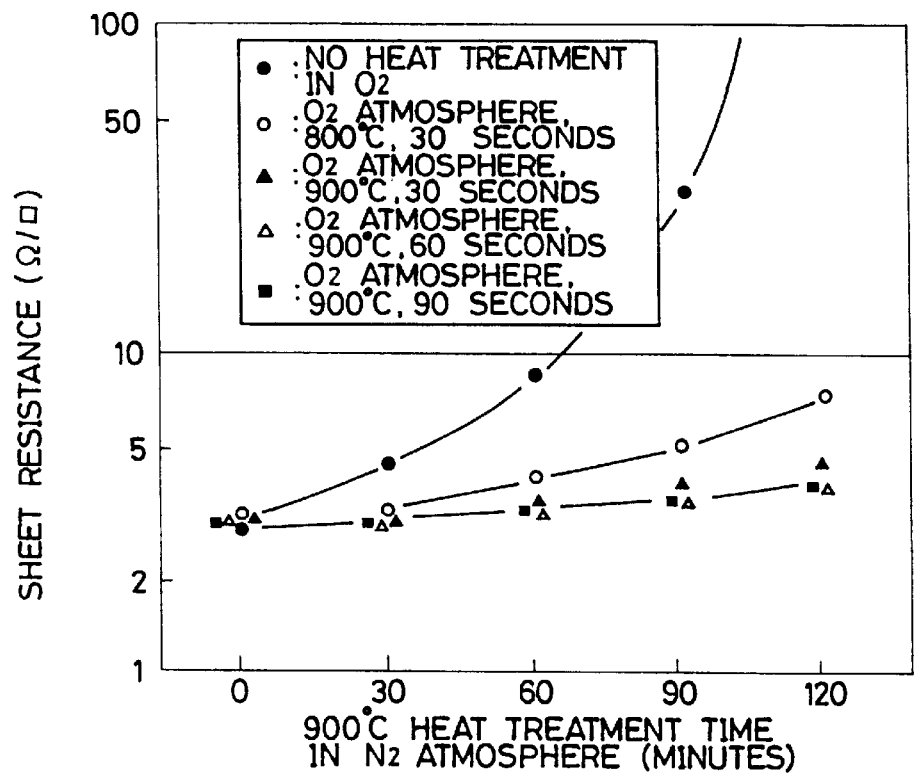
FIGS. 6 and 7 are diagrams showing the resistance characteristic of the titanium silicide film which has been formed according to the manufacturing method of the present invention.

In the diagram of FIG. 6, there are shown experimental data to verify the restraining effect of forming the oxide film 14 against agglomeration in the titanium silicide film 13. The data of this diagram show results of the examination made of agglomeration in the titanium silicide film which has been formed to be about 48 nm thick and then heat treated at 800° C. to 900° C. for 30 to 90 seconds in oxygen atmosphere. Evaluation of the agglomeration was made by measuring sheet resistance of the titanium silicide film at predetermined time periods of heat treatment which has gotten a 200 nm thick silicon dioxide film deposited thereon by CVD after thermal oxidation and then heat treated at 900° C. in nitrogen atmosphere.

From those measurement results, it can be seen that the heat treatment in oxygen atmosphere after formation of the titanium silicide has considerably restrained the resistance increase which might have accompanied the subsequent heat treatment.

As described in the foregoing, according to the present embodiment, in the manufacturing process of a salicide transistor to which titanium silicide is applied, the agglomeration in the titanium silicide film 13 can be suppressed in case of the annealing which is intended for reflow of the interlayer insulating film 8 or thermal diffusion of SAC. Accordingly, resistance in the gate electrode 3 and the source/drain regions can be kept lower and degradation of the junction characteristic of the source/drain regions can be prevented as well, thereby allowing a high performance salicide transistor to be obtained.

Figure 7:
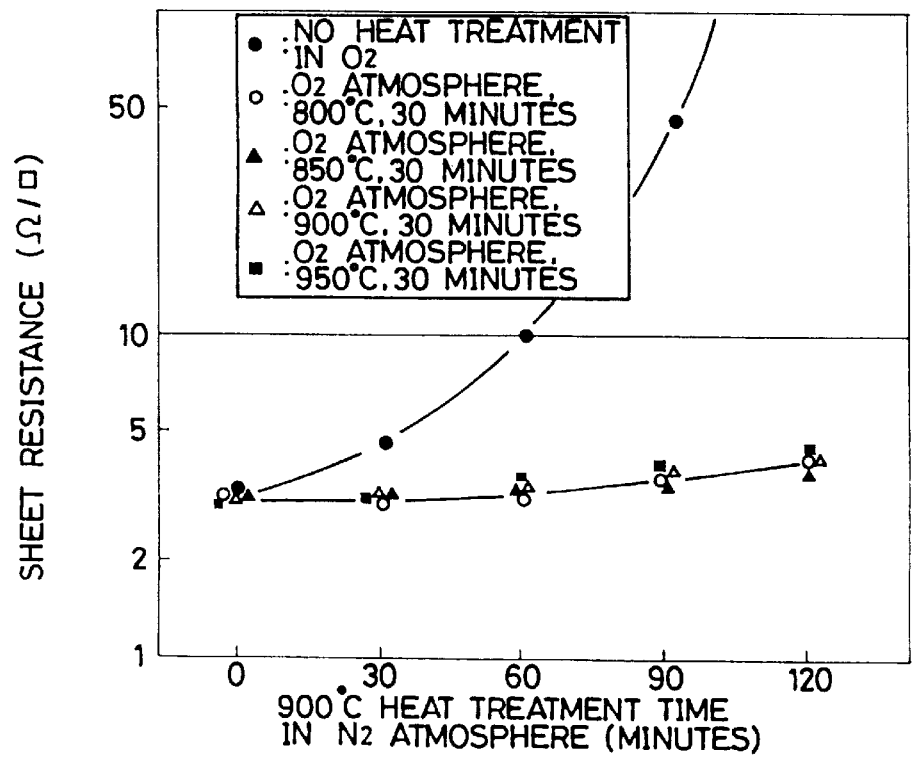

While in the above mentioned embodiment, a description has been made on the method where the heat treatment in oxygen atmosphere is done by the rapid thermal annealing, the same effects can be obtained by the furnace annealing. As an example of the furnace annealing, another diagram similar to FIG. 6 is shown in FIG. 7, handling the case of furnace annealing where after formation of a titanium silicide film, a 100 nm thick silicon oxide film was deposited by CVD and then heat treatment at 800° C. for 30 minutes in oxygen atmosphere was given. Even when the heat treatment in oxygen atmosphere has been done after formation of the silicon oxide film, the resistance increase due to the subsequent 900° C. anneal is negligibly small, which means that the agglomeration resistivity has been improved. This may be attributed to the fact that oxygen can readily penetrate through the silicon oxide film during the thermal oxidation.

While the diagram in FIG. 7 shows the example where the thermal oxidation occurs after formation of the silicon dioxide film on surface of the titanium silicide film, it has been recognized that the same characteristics can be obtained in case of the silicon oxide films doped with phosphorus or boron, such as PSG (Phosphorus Doped Silicate Glass) or BPSG (Boron and Phosphorus Doped Silicate Glass) film.

While the embodiment above has been described on the example where the present invention has been applied to the salicide transistor utilizing titanium silicide, application of the invention cannot be limited to that.

For example, it is also possible to form the titanium silicide only on either surface of the gate electrode and the source/drain regions of an MOS type field effect transistor. In this case, when a titanium film is deposited, mask should be provided on the silicon surfaces where the titanium silicide formation is not necessary.

Figure 8:
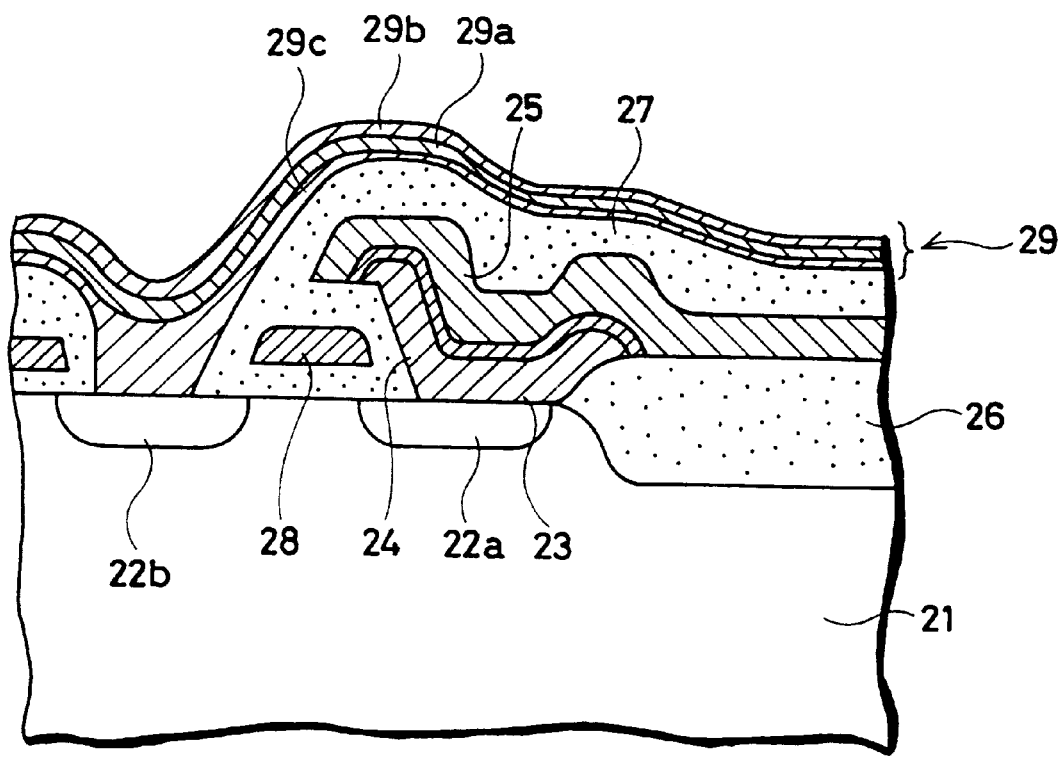
FIG. 8 is a cross sectional view showing an example where the present invention is applied to formation of bit lines in a stacked capacitor type memory cell.

Furthermore, application of highly refractory titanium silicide of the present invention for bit line formation in a stacked capacitor type memory cell as shown in FIG. 8 is also possible. The stacked capacitor type memory cell is available for a DRAM memory cell. In this memory cell, as shown in FIG. 8, electric charge is stored between the lower electrode 23 formed in contact with the impurity diffused layer 22a which has been formed on main surface of the silicon substrate 21 through diffusion and the upper electrode 25 formed with the charge storage insulating film 24 interposed therebetween. Thus constituted capacitor portion is separated by the device isolating region 26 and covered with the interlayer insulating film 27. A plurality of capacitor portions are disposed to be interconnected by the word line 28 and the bit line 29. While an aluminum line or the like is generally employed to form the bit line 29, there exists a strong demand for application of titanium silicide due to its low resistivity and is refractory characteristics. When the bit line is to be formed of titanium silicide, a polycrystalline silicon film is first formed by CVD and the like in a region of the device surface covered with the interlayer insulating film 27 where the bit line 29 is to be formed. A titanium film of a predetermined thickness is then deposited on this polycrystalline silicon film by sputtering or the like, and heat treatment at 600° C. to 700° C. in nitrogen atmosphere is done for a predetermined time to form the titanium silicide film 29a. Under the titanium silicide film 29a, the policrystaline silicon film 29c remains without being fully silicidized. Thereafter, additional heat treatment at 600° C. to 1,000° C. (preferably 800° C. to 900° C.) in oxygen atmosphere is done to form an oxide film 29b such as of $TiO_x$, $SiO_2$ on surface of the titanium silicide 29a. Also in this case, for the purpose of reducing contact resistance at the contact surface between the bit line 29 and the impurity diffused layer 22b, 800° C. to 1,000° C. anneal is required after formation of the bit line 29. Furthermore, when the next interlayer insulating film is formed over the bit line, high temperature anneal is usually used for the planarization of the insulating film. Therefore, if the oxide film 29b has not been formed, agglomeration will be caused in the titanium silicide film 29a in the annealing. This leads to the resistance value increase in the bit line 29 and degradation of the memory cell characteristic. Accordingly, in this case also, application of the present invention enables a good quality memory cell using titanium silicide to be obtained.

Additionally, it becomes also possible to apply titanium silicide in forming interconnections in a planar structure of a complementary MOS transistor and the like, or other general interconnections in a semiconductor circuit where subsequent annealing is required. Consequently, the present invention can widely meet the demand of industry requiring the low resistivity titanium silicide to be applied to interconnections of the semiconductor devices high integration of which advances everyday.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a thermally stable titanium silicide structure comprising a titanium silicide film formed on a silicon crystal surface, and a thermal oxide, comprising titanium oxide and silicon dioxide, formed on a surface of said titanium silicide, wherein said thermal oxide film prevents agglomeration of said titanium silicide film at temperatures between 800° C. and 1,000° C. which agglomeration would occur in the absence of said thermal oxide.

2. A semiconductor device according to claim 1, wherein said thermal oxide film has a thickness within the range of 50 to 500 Å.

3. A thermally stable titanium silicide structure according to claim 2, wherein said thermal oxide film has a thickness within the range of 50 to 500 Å.

4. A thermally stable titanium silicide structure according to claim 2, wherein said titanium silicide film has a thickness of about 48 nm.

5. A semiconductor device according to claim 1, wherein said titanium silicide film has a thickness of about 48 nm.

6. A semiconductor device according to claim 1, wherein an insulating film is further deposited on a surface of said thermal oxide film.

7. A semiconductor device according to claim 1, wherein said silicon crystal surface comprises a surface of a gate electrode of an MOS field effect transistor.

8. A semiconductor device according to claim 1, wherein said silicon crystal surface comprises a surface of a source/drain region of an MOS field effect transistor.

9. A semiconductor device according to claim 1, wherein said silicon crystal surface comprises a surface of a polycrystalline silicon layer formed on a substrate or an insulating film surface so as to have a predetermined pattern.

10. A semiconductor device having a silicon crystal surface and including a field effect transistor having a gate electrode means and further including source and drain regions each comprising an impurity region formed in said silicon crystal surface, said gate electrode means including a silicon crystal surface layer, and said source and drain regions each including:
   a titanium silicide layer formed on said silicon crystal surface layer; and
   a thermal oxide film, comprising titanium oxide and silicon dioxide, formed on the surface of the said titanium silicide layer, wherein said thermal oxide film prevents agglomeration of said titanium silicide film at temperatures between 800° C. and 1,000° C. which agglomeration would occur in the absence of said thermal oxide.

11. A semiconductor device according to claim 10, wherein said thermal oxide film has a thickness within the range of 50 to 500 Å.

12. A semiconductor device according to claim 10, wherein said titanium silicide film has a thickness of about 48 nm.

13. A thermally stable titanium silicide structure comprising a uniformly thick titanium silicide film and a thermal oxide film formed thereon, said thermally stable titanium silicide structure produced by:
   depositing titanium on a silicon crystal surface to form a titanium film;

subjecting said titanium film to a first heat treatment in a non-oxidizing atmosphere to form a titanium silicide film; and thereafter subjecting said titanium silicide film to a second heat treatment in an oxygen containing atmosphere at a temperature of between 600° C. and 1,000° C. to oxidize said titanium silicide film and form thereon a thermal oxide film, comprising titanium oxide and silicon dioxide, wherein said thermal oxide film prevents agglomeration of said titanium silicide film at temperatures between 800° C. and 1,000° C. which agglomeration would occur in the absence of said thermal oxide, thereby insuring that the thickness of said titanium silicide film remains uniform.

* * * * *